(12) United States Patent
Furutani et al.

(10) Patent No.: US 8,908,457 B2
(45) Date of Patent: Dec. 9, 2014

(54) SEMICONDUCTOR DEVICE

(75) Inventors: Kiyohiro Furutani, Tokyo (JP); Takuya Kadowaki, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 233 days.

(21) Appl. No.: 13/455,668

(22) Filed: Apr. 25, 2012

(65) Prior Publication Data

US 2012/0275256 A1    Nov. 1, 2012

(30) Foreign Application Priority Data

Apr. 26, 2011    (JP) ................................. 2011-098446

(51) Int. Cl.
| | | |
|---|---|---|
| *G11C 7/06* | (2006.01) | |
| *G11C 7/08* | (2006.01) | |
| *G11C 11/406* | (2006.01) | |
| *G11C 11/4074* | (2006.01) | |
| *G11C 11/4076* | (2006.01) | |
| *G11C 11/4091* | (2006.01) | |
| *G11C 7/22* | (2006.01) | |

(52) U.S. Cl.
CPC ............ *G11C 7/08* (2013.01); *G11C 11/40618* (2013.01); *G11C 11/4074* (2013.01); *G11C 11/4076* (2013.01); *G11C 11/4091* (2013.01); *G11C 7/222* (2013.01)
USPC ....................................................... 365/207

(58) Field of Classification Search
None
See application file for complete search history.

(56) References Cited

U.S. PATENT DOCUMENTS

| | | | |
|---|---|---|---|
| 7,599,238 B2 * | 10/2009 | Cho .............................. | 365/205 |
| 8,300,480 B2 | 10/2012 | Furutani | |
| 2007/0183236 A1 * | 8/2007 | Jeong ............................ | 365/207 |
| 2010/0191987 A1 | 7/2010 | Furutani et al. | |

FOREIGN PATENT DOCUMENTS

| | | |
|---|---|---|
| JP | 2003-068073 A | 3/2003 |
| JP | 2009-217844 A | 9/2009 |
| JP | 2010-176742 A | 8/2010 |
| JP | 2011-84855 A | 4/2011 |

\* cited by examiner

*Primary Examiner* — James G Norman
(74) *Attorney, Agent, or Firm* — Sughrue Mion, PLLC

(57) ABSTRACT

A device may include, but is not limited to, a bit line; a power line supplied with a power voltage; a sense amplifier circuit amplifying a voltage of the bit line by using the power voltage of the power line; and a control circuit configured to respond to an active command and supply, as the power voltage, the power line with a first voltage during a first period and a second voltage lower than the first voltage during a second period. The control circuit is further configured to respond to a refresh command and supply, as the power voltage, the power line with the second voltage during both the first and second periods.

8 Claims, 9 Drawing Sheets

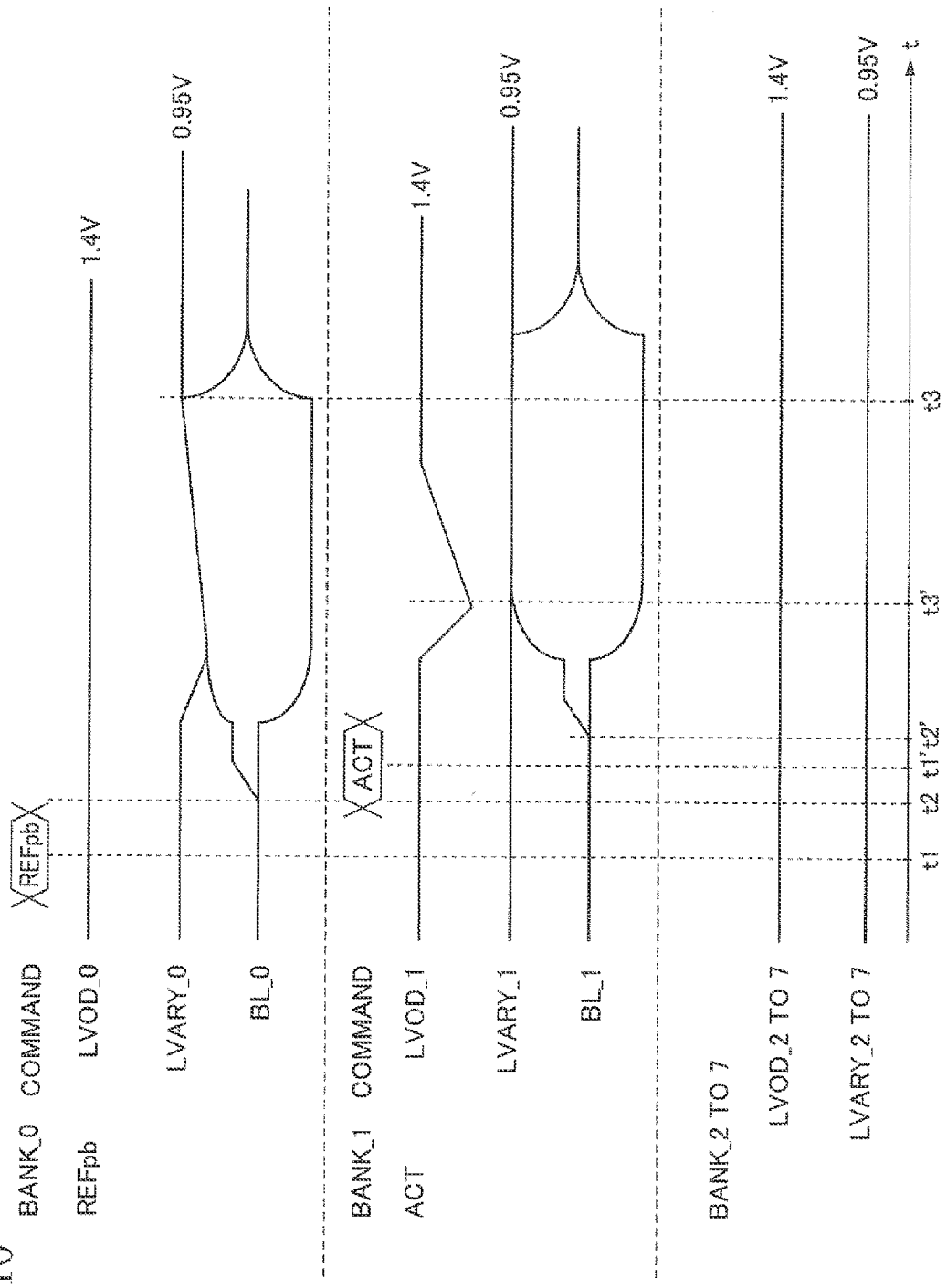

SEMICONDUCTOR DEVICE

BACKGROUND OF THE INVENTION

1. Field of the Invention

The present invention generally relates to a semiconductor device.

Priority is claimed on Japanese Patent Application No. 2011-098446, filed Apr. 26, 2011, the content of which is incorporated herein by reference.

2. Description of the Related Art

In a semiconductor device such as a DRAM (dynamic random access memory), in order to amplify minute signals read out from memory cells, sense amplifiers are provided for each bit line pair. When writing data into a memory cell, the sense amplifier performs a sensing operation that pulls one of the bit lines up to the high level and pulls the other bit line down to the low level. For this reason, high-level and low-level power supply voltages are supplied to the sense amplifier during the time of the sensing operation. In recent years, in order to pull the bit line that is pulled up to the high level more quickly to the high level, the overdrive method is used. The overdrive method is a method whereby, at the beginning of the sense operation period, an overdrive voltage that is higher than the high-level power supply voltage is supplied to the sense amplifier and, by adopting this method, it is possible to achieve a high-speed sense operation at the beginning of the sense operation.

Japanese Patent Application Publication No. JPA 2003-68073 discloses that, in a semiconductor device featuring the overdrive method, an overdrive voltage is supplied to the sense amplifier in response to the activation of an active command and a refresh command. The semiconductor device uses overdrive not only at the time of the active operation, but also at the time of the refresh operation. In the refresh operation, when there is no access (writing or reading) with respect to the memory, current is consumed, and a large power consumption results.

SUMMARY

In one embodiment, a device may include, but is not limited to, a bit line; a sense amplifier, and a power voltage generating circuit. The sense amplifier includes a power line. The sense amplifier is configured to amplify a voltage of the bit line by using a voltage to be supplied to the power line. The power voltage generating circuit is configured, when an active command is activated, to over-drive the sense amplifier to supply a first voltage to the power line in an initial period of time included in a first voltage supply period of time corresponding to the active command. The power voltage generating circuit is configured to supply a second voltage to the power line after the initial period of time has passed, the second voltage being lower than the first voltage. The power voltage generating circuit is configured, when a refresh command is activated, to supply the second voltage to the power line throughout the first voltage supply period of time, without over-driving the sense amplifier and without supplying the first voltage to the power line.

In another embodiment, a method of driving a semiconductor device performing a refresh operation of the semiconductor device without supplying an over-drive voltage to a power line included in a sense amplifier included in the semiconductor device; and performing an active operation of the semiconductor device by supplying the over-drive voltage to the power line at least in an initial period of time of the active operation.

In still another embodiment, a method of driving a sense amplifier may include, but is not limited to, over-driving the sense amplifier, when an active command is activated, to supply a first voltage to a power line included in the sense amplifier, in an initial period of time included in a first voltage supply period of time corresponding to the active command; supplying a second voltage to the power line after the initial period of time has passed, the second voltage being lower than the first voltage; and supplying the second voltage to the power line, when a refresh command is activated, throughout the first voltage supply period of time, without over-driving the sense amplifier and without supplying the first voltage to the power line.

BRIEF DESCRIPTION OF THE DRAWINGS

The above features and advantages of the present invention will be more apparent from the following description of certain preferred embodiments taken in conjunction with the accompanying drawings, in which:

FIG. 10 is a timing chart of a memory bank shown in FIGS. 1 and 2.

DETAILED DESCRIPTION OF THE PREFERRED EMBODIMENTS

Figure 1:
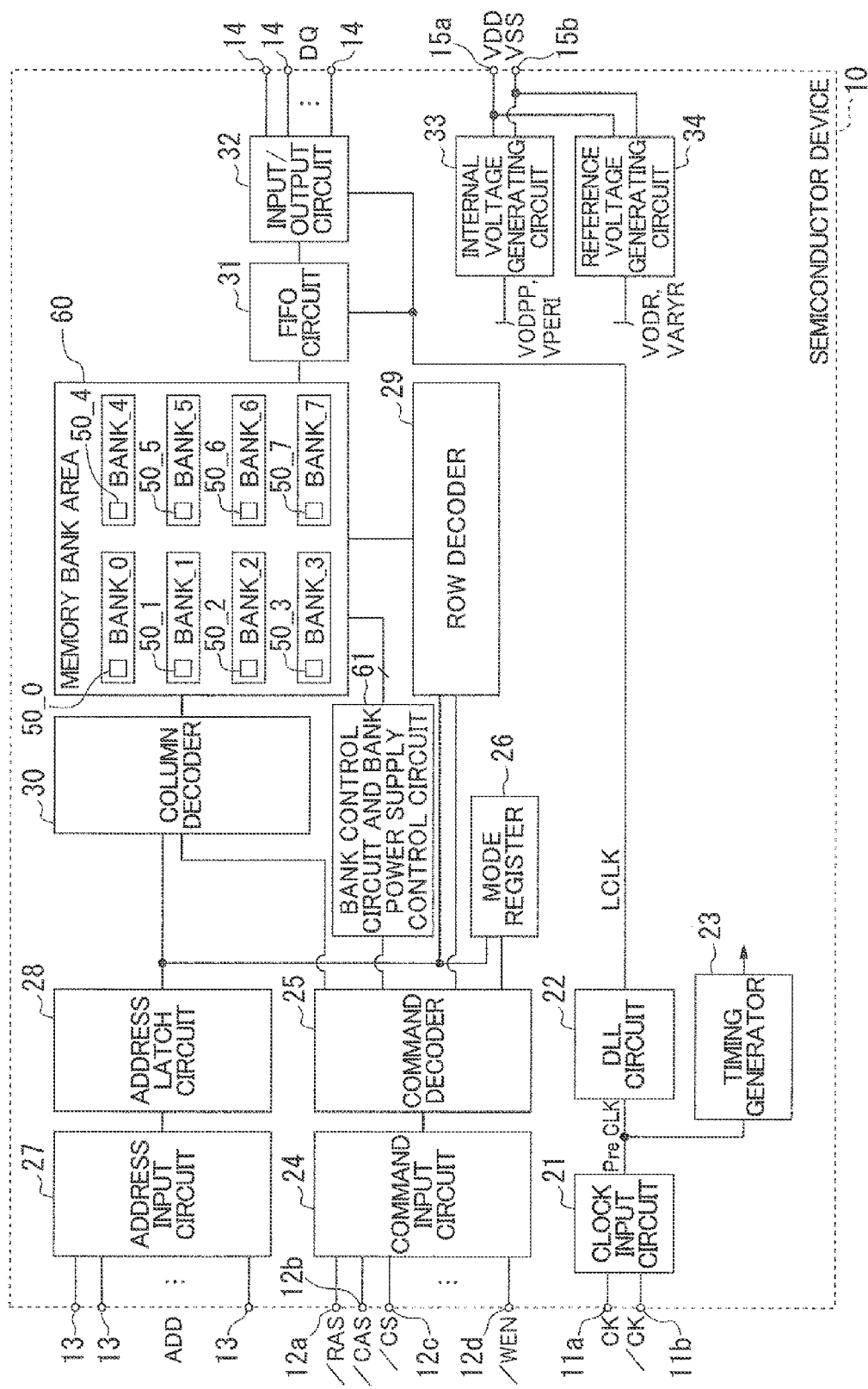
FIG. 1 is a block diagram illustrating a configuration of a semiconductor device in one or more embodiments of the present invention.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a device may include, but is not limited to, a bit line; a power line supplied with a power voltage; a sense amplifier circuit amplifying a voltage of the bit line by using the power voltage of the power line; and a control circuit configured to respond to an active command and supply, as the power voltage, the power line with a first voltage during a first period and a second voltage lower than the first voltage during a second period. The control circuit is further configured to respond to a refresh command and supply, as the power voltage, the power line with the second voltage during both the first and second periods.

In some cases, the device may further include, but is not limited to another power line supplied with another power voltage. The control circuit further is configured to respond to the active command and supply, as the other power voltage, the other power line with a ground voltage during both the first and second periods. The control circuit is further configured to respond to the refresh command and supply, as the other power voltage, the other power line with the ground voltage during both the first and second periods.

In some cases, the device may further include, but is not limited to, a first line supplied with the first voltage; a second line supplied with the second voltage; a first transistor provided between the first line and the power line and controlled by a first control signal; and a second transistor provided between the second line and the power line and controlled by a second control signal. The control circuit is further configured to respond to the active command and activate the first control signal during the first period and the second control signal during the second period. The control circuit is further configured to respond to the refresh command and activate the second control signal during both the first and second periods.

In some cases, the device may further include, but is not limited to, a first voltage generating circuit supplying the first voltage to the first line; and a second voltage generating circuit supplying the second voltage to the second line.

In some cases, the device may further include, but is not limited to, a plurality of memory banks, each including the bit line, the power line, the sense amplifier circuit, the first and second lines, the first and second transistors, and the first and second voltage generating circuits.

In some cases, each of the memory banks further includes another power line supplied with another voltage. The control circuit each of the memory banks is further configured to respond to the active command and supply, as the other power voltage, the other power line with a third voltage during both the first and second periods. The control circuit of each of the memory banks is further configured to respond to the refresh command and supply, as the other power voltage, the other power line with the third voltage during both the first and second periods.

In some cases, the device may further include, but is not limited to, a first standby power supply circuit supplying the first line with the first voltage during a third period excluding the first and second periods; and a second standby power supply circuit supplying the second line with the second voltage during the third period.

In some cases, the device may further include, but is not limited to, a first standby power supply circuit supplying the first line with the first voltage during a third period excluding the first and second periods; and a second standby power supply circuit supplying the second line with the second voltage during the third period.

In another embodiment, a method may include, but is not limited to, enabling a sense amplifier during a first predetermined period in response to an active command, the first predetermined period including first and second periods, the sense amplifier operating a first voltage during the first period and a second voltage during the second period, the first voltage being larger than the second voltage; and enabling the sense amplifier during a second predetermined period in response to a refresh command, the second predetermined period substantially including the first predetermined period, the sense amplifier operating the second voltage over a substantially whole of the second predetermined period.

In still another embodiment, a method may include, but is not limited to, amplifying a potential of a bit line by using a first voltage and a second voltage lower than the first voltage in an active operation mode; and amplifying the potential of the bit line by using only the second voltage without using the first voltage in a refresh mode.

Embodiments

FIG. 1 illustrates a semiconductor device, for example, a semiconductor device 10 that is an SDRAM (synchronous dynamic random-access memory) that operates in synchronization with a clock signal that is supplied from outside. The circuit blocks shown in FIG. 1 are all formed on a single semiconductor chip made of single-crystal silicon. Each of the circuit blocks is constituted by a plurality of transistors such as, PMOS transistors (p-channel MOS transistors) and NMOS transistors (n-channel MOS transistors). The locations marked by small circles are pads used as external terminals provided on the semiconductor chip.

The semiconductor device 10 is constituted to include a clock input circuit 21, a DLL circuit 22, a timing generator 23, a command input circuit 24, a command decoder 25, a mode register 26, an address input circuit 27, an address latch circuit 28, a row decoder 29, a column decoder 30, a FIFO circuit 31, and an input/output circuit 32. The constitution of the semiconductor device 10 also includes an internal voltage generating circuit 33, a reference voltage generating circuit 34, a memory bank area 60, and a bank control circuit and bank power supply control circuit 61.

The bank control circuit and bank power supply control circuit 61, which is a characteristic part of the semiconductor device 10 of the present invention outputs a plurality of control signals to the memory banks BANK_0 to BANK_7 in the memory bank area 60, in response to internal command signals output by the command decoder 25. Each memory bank BANK_k is provided with an independent power supply voltage generating circuit 50_k. The power supply voltage generating circuit 50_k, based on the plurality of control signals, drives the sense amplifier power supply line (a line that supplies a power to the sense amplifier). Sense amplifiers in each of the memory banks BANK_k, based on the voltage supplied to the sense amplifier power supply line, execute a sensing operation. While details of this sensing operation will be described later, a summary of the semiconductor device 10 will first be presented below.

The semiconductor device 10 has, as external terminals, clock terminals 11a, 11b, command terminals 12a to 12d, address terminals 13, a data input/output terminals 14, and power supply terminals 15a, 15b. Data strobe and reset terminals are also provided, although these are omitted from the drawing.

The clock terminals 11a, 11b are terminals to which the external clock signals CK and /CK are supplied, and the supplied external clock signals CK and /CK are input to the clock input circuit 21. In the present specification, signal names with a slash (/) before the signal name indicate a signal that is the negation (inversion) of a signal or an active-low signal. Therefore, the external clock signals CK and /CK are mutually complementary signals. The clock input circuit 21, based on the external clock signals CK and /CK, generates a single-phase internal clock signal PreCLK, which it outputs to the DLL circuit 22 and the timing generator 23. The DLL circuit 22, based on the internal clock signal PreCLK, generates a phase-controlled internal clock LCLK, which it outputs to the FIFO circuit 31 and the data input/output circuit 32. The timing generator 23, based on the internal clock signal PreCLK, supplies to the other circuits in the semiconductor device 10 an internal clock signal that serves as a reference signal for operation.

The command terminals 12a to 12d are terminals to which are supplied, respectively, a row address strobe signal /RAS, a column address strobe signal /CAS, a chip select signal /CS, and a write enable signal /WEN. A command signal CMD is constituted by a combination of the signals input at these terminals. The command signal CMD is input to the command input circuit 24. The command decoder 25 holds the command signal CMD input via the command input circuit 24, and subjects it to decoding and the like so as to generate various internal command signals ICMD (the internal command signals ACT_k, REF_k and the like, which are described later). The generated internal command signals ICMD are supplied to the row decoder 29, which is a row control circuit, the column decoder 30, which is a column control circuit, the bank control circuit and bank power supply control circuit 61, and the mode register 26.

The address terminals 13 are terminals to which an address signal ADD is supplied, the supplied address signal ADD being input to the address input circuit 27. The output of the address input circuit 27 is input to the address latch circuit 28. Of the address signal ADD latched by the address latch circuit 28, the row address is input to the row decoder 29 and the column address is input to the column decoder 30. In the case in which entry is made into the mode register set, the address signal ADD is input to the mode register 26 as well, thereby updating the contents of the mode register 26.

The row decoder 29 is a circuit that selects one of the word lines WL that are included in the memory banks BANK of the memory bank area 60. The column decoder 30 is a circuit that selects one of the sense amplifiers SA that is included in the sense amplifiers in the memory banks BANK of the memory bank area 60. The sense amplifier SA selected by the column decoder 30 is connected, for example, to a data amplifier that is not illustrated. The data amplifier further amplifies the read data that is amplified by the sense amplifier SA during a read operation, and outputs the result to the FIFO circuit 31 via a read/write bus. When a write operation occurs, the data amplifier amplifies write data input from the FIFO circuit 31 via the read/write bus, and outputs the result to the sense amplifier SA. The FIFO circuit 31 is connected to the data input/output circuit 32.

The data input/output terminals 14 are terminals for performing output of read data DQ and input of write data DQ, and are connected to the data input/output circuit 32. When a read operation is done, the data input/output circuit 32 outputs the read data as the read data DQ from the FIFO circuit 31 in parallel to the data input/output terminals 14, in synchronization with the internal clock LCLK. When a write operation is done, the data input/output circuit 32 outputs the write data DQ from the data input/output terminals 14 in series to the FIFO circuit 31, in synchronization with the internal clock LCLK. There are a plurality of data input/output terminals 14, shown in FIG. 1, and the number thereof can be any number, such as 4, 8, or 16.

The power supply terminals 15a, 15b are terminals for supplying the external voltage VDD and the ground voltage VSS, respectively. In the present specification, the voltage between the external voltage VDD and the ground voltage VSS is sometimes referred to simply as the external voltage VDD. The power supply terminals 15a, 15b are each connected, respectively, to the internal voltage generating circuit 33 and the reference voltage generating circuit 34. The external voltage VDD is supplied to the internal voltage generating circuit 33, which generates as a plurality of internal voltages responsive to the roles of internal circuits, for example, a first internal voltage VODPP (for example, 1.6 V) and a second internal voltage VPERI (for example, 1.2 V). The reference voltage generating circuit 34 generates as a plurality of reference voltages, for example, a first reference voltage VODR (for example, 1.4 V) and a second reference voltage VARYR (for example, 0.95 V) and the like. These internal voltages and reference voltages are each supplied to corresponding internal circuits.

The memory bank area 60 is constituted so as to include memory banks BANK_0 to BANK_7.

In this case, a memory bank BANK_k (where k=0 to 7) is constituted by an arrangement of a plurality of memory cell array regions that have a plurality of memory cells provided at the intersections of a plurality of word lines and a plurality of bit lines, and is a unit with respect to which independent operations of reading, writing or refreshing and the like with respect to a memory cell can be performed (operations based on control signals supplied from the BANK control circuit and BANK power supply control circuit 61). For example, the memory bank BANK_0 is activated when an activate command is input to the command input circuit 24, and performs an operation (sensing operation) in response to the ACT command. Because the command input circuit 24 and the input/output circuit 32 and the like are shared between memory banks, the memory bank BANK_1 cannot perform an operation in response to another command received simultaneously with the memory bank BANK_0. However, during the period of time from the point at which the memory bank BANK_0 receives an active command to the point at which a read command for data read-out or a write command for data writing is received or in the period of time after receiving these commands, the memory bank BANK_1 is activated by the input of a refresh command to the command input circuit 24, and can perform a refresh operation (sensing operation) in response to the refresh command.

Although in FIG. 1 eight memory banks are provided in the memory bank area 60, the number of memory banks is not restricted to eight and may be, for example, four.

Figure 2:
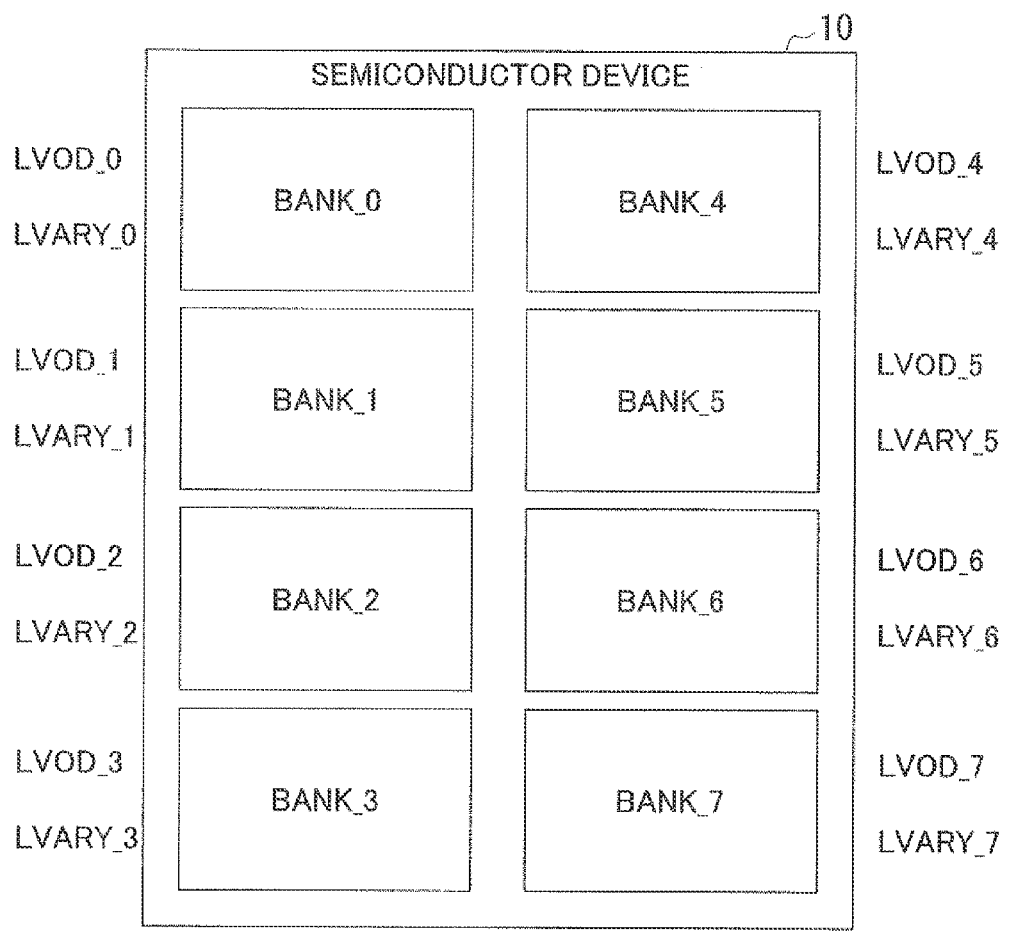
FIG. 2 is a view illustrating a layout of the semiconductor device of FIG. 1.

FIG. 2 is a schematic view of a layout of the semiconductor device 10 shown in FIG. 1.

In FIG. 2, peripheral circuitry is provided in the peripheral region of the semiconductor device 10, in which BANK_0 to BANK_7 are not provided. The peripheral circuitry is, for example, circuits other than the memory bank area 60 shown in FIG. 1 (command decoder 25, address latch circuit 28, internal voltage generating circuit 33, BANK control circuit and BANK power supply control circuit 61 and the like).

The memory bank area 60 is supplied with the first internal voltage VODPP (1.6 V) and the second internal voltage VPERI (1.2 V) from the above-noted internal voltage generating circuit 33, and the first reference voltage VODR and the second reference voltage VARYR from the reference voltage generating circuit 34.

A power supply voltage generating circuit 50_k is provided in each of the memory banks BANK_0 to BANK_7. The power supply voltage generating circuit 50_k, based on these supplied voltages, generates a sense amplifier SA drive voltage and, via the first power supply line LVOD_k and the second power supply line LVARY_k shown in FIG. 2, supplies the generated drive voltage to the sense amplifiers SA provided in each of the memory banks.

Figure 3:
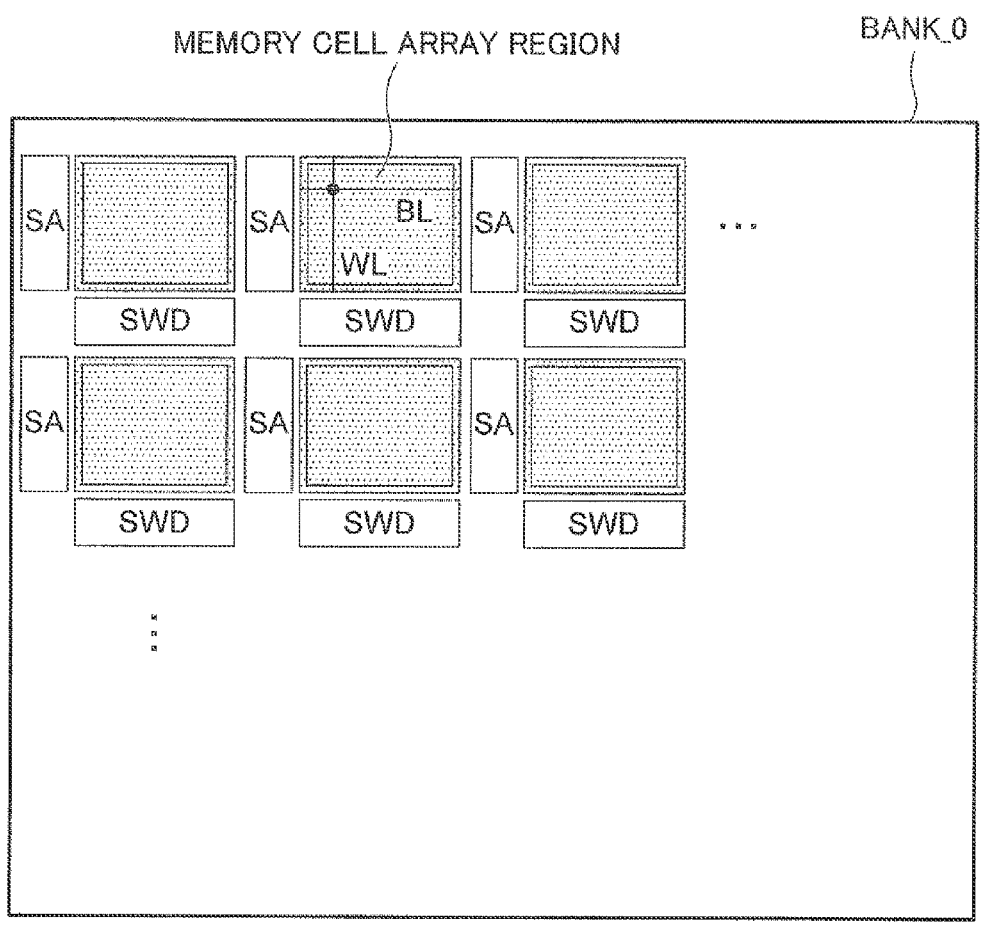
FIG. 3 is a view illustrating part of the layout of the semiconductor device of FIG. 2.

FIG. 3 shows a layout of the memory bank BANK_0 shown in FIG. 2 in enlarged form. The memory bank BANK_0 has a plurality of memory cell array regions. Each memory cell array region has a plurality of bit lines BL and a plurality of word lines WL, a memory cell MC being provided at each intersection between the bit lines and the word lines. Corresponding to each memory cell array region there is a subword driver SWD and a sense amplifier SA that amplifies the potential on the bit line. Also, although not shown in FIG. 2, a power supply voltage generating circuit is provided for each memory bank in each of the memory banks, as will be described later using FIG. 5. The other memory banks BANK_1 to BANK_7 within the memory bank area 60 have the same structure as that of the memory bank BANK_0.

Figure 4:
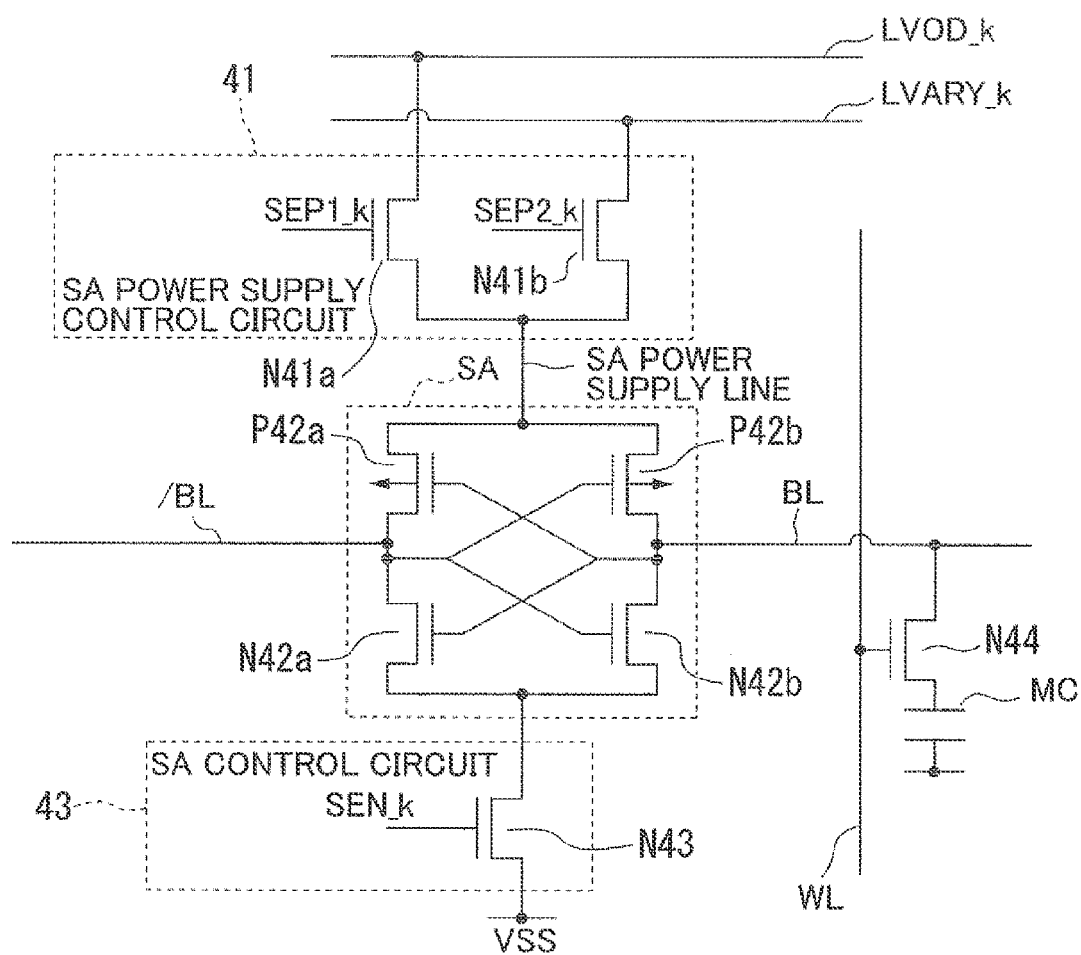
FIG. 4 is a circuit diagram illustrating a sense amplifier and a control circuit controlling the sense amplifier in the memory bank in FIG. 2.

FIG. 4 is a circuit diagram of the sense amplifier SA and the associated control circuit in the memory banks BANK_k shown in FIG. 2.

As shown in FIG. 4, the sense amplifier SA is constituted by, for example, transistors P42a, P42b, which are PMOS transistors, and transistors N42a, N42b, which are NMOS transistors. In the present embodiment described below, transistors with reference symbols prefixed by N are NMOS transistors, and transistors with reference symbols prefixed by P are PMOS transistors.

In the transistor P42a, the source is connected to the SA power supply line, the gate is connected to the bit line BL, and the drain is connected to the bit line /BL. In the transistor P42b, the source is connected to the SA power supply line, the gate is connected to the bit line /BL, and the drain is connected to the bit line BL. In the transistor N42a, the drain is connected to the bit line /BL, the gate is connected to the bit line BL, and the source is connected to the drain of the transistor N43. In the transistor N42b, the drain is connected to the bit line BL, the gate is connected to the bit line /BL, and the source is connected to the drain of the transistor N43.

An SA control circuit 43 is constituted by the transistor N43. In this transistor N43, the drain is connected to the sources of the above-noted transistors N42a and N42b, the gate is connected to the BANK_k control circuit and has the control signal SEN_k input thereto, and the source is grounded.

The SA power supply control circuit 41 is constituted by the transistor 41a (first power supply control circuit) and the transistor N41b (second power supply control circuit). In the transistor N41a, the drain is connected the first power supply line VLOD_k, the gate is connected to the BANK_k control circuit and has the control signal SEP1_k (first sense enable signal) input thereto, and the source is connected to the SA power supply line. In the transistor N41b, the drain is connected to the second power supply line LVARY_k, the gate is connected to the BANK_k control circuit and has the control signal SEP2_k (second sense enable signal) input thereto, and the source is connected to the SA power supply line.

Upon input of the control signal from the BANK_k control circuit, the sense amplifier SA amplifies the potential difference generated by the selection of a word line WL between the bit line BL and the bit line /BL that form a pair, thereby causing a transition of the voltage level on one of the bit lines to the voltage level of the SA power supply line and a transition of the voltage level on the other bit line to the ground level (VSS level).

In the present embodiment, upon the input from the outside of an active command or a refresh command, in the memory bank BANK_k, the word line WL selected in response to the command is activated, and data from the corresponding memory cell MC is read out to the bit line BL. The sense amplifier SA uses the overdrive voltage VOD (first voltage) and the bit line final voltage VARY (second voltage) supplied to the SA power supply line via the first power supply line LVOD_k and second power supply line VARY_k, respectively, and amplifies the minute potential generated on the bit line up to the bit line final voltage VARY. In the case, for example, in which the memory cell MC holds a high level, the potential on the bit line BL is amplified to the voltage level of the bit line final voltage VARY, and the potential on the bit line /BL is amplified to the voltage level of the ground voltage VSS. By doing this, the memory cell MC is overwritten with a voltage that is the same level as the bit line final voltage VARY, via the cell transistor N44.

To describe this in more detail, in the present embodiment, in order for the memory bank BANK_k to perform an overdrive operation when an active command is input from the outside, it uses the overdrive voltage VOD to cause amplification of the potential on the bit line for a prescribed period of time (making the control circuit SEP1_k the active level and the control signal SEP2_k the inactive level), after which it uses the bit line final voltage VARY to amplify the potential on the bit line, maintaining the voltage level on the bit line at the bit line final voltage VARY (making the control circuit SEP1_k the inactive level and the control signal SEP2_k the active level).

The reason for this is that, in the case in which an active command is input, the amount of time (tRCD) from the input of the active command until the read command, for example, becomes valid is established by specifications, so that it is necessary to amplify the bit line potential at high speed, within the time tRCD. Therefore, by using an overdrive voltage VOD that is larger than the bit line final voltage VARY such as described above (by overdrive operation), it is possible to amplify the bit line potential at a high speed.

In contrast to the above, upon the input of a refresh command from the outside, because there is no restraint with regard to tRCD or the like, the memory bank BANK_k need not cause amplification of the potential on the bit line at a high speed, in comparison with when an active command is input from the outside. Using this, therefore, at the time of a refresh, amplification of the potential on the bit line is caused with only the bit line final voltage VARY, without using the overdrive voltage VOD that is a cause for an increase of the amount of current consumption (making the control signal SEP1_k the inactive level and making the control signal SEP2_k the active level). By doing this, because the overdrive voltage VOD is not used, the effect is to lead to a reduction in the amount of current consumption.

In the present embodiment, the voltage used in refresh sensing need not be the bit line final voltage VARY. For example, in order to reduce the current consumption further, a voltage that is lower than the bit line final voltage VARY may be used. A voltage (third voltage) that is a higher voltage than the bit line final voltage VARY and lower than the overdrive voltage VOD may be used, the bit line potential being amplified at first toward the overdrive level, in the same manner as when an active command is input, and the voltage being switched midway so as to use the bit line final voltage VARY to perform the amplification operation. That is, the thrust of the present invention is that, regardless of which means is used for amplification, in the case in which the refresh command is input, a voltage lower than the overdrive voltage VOD (first voltage) is used to amplify the potential on the bit line that becomes the high level up to the bit line final voltage VARY.

Figure 5:
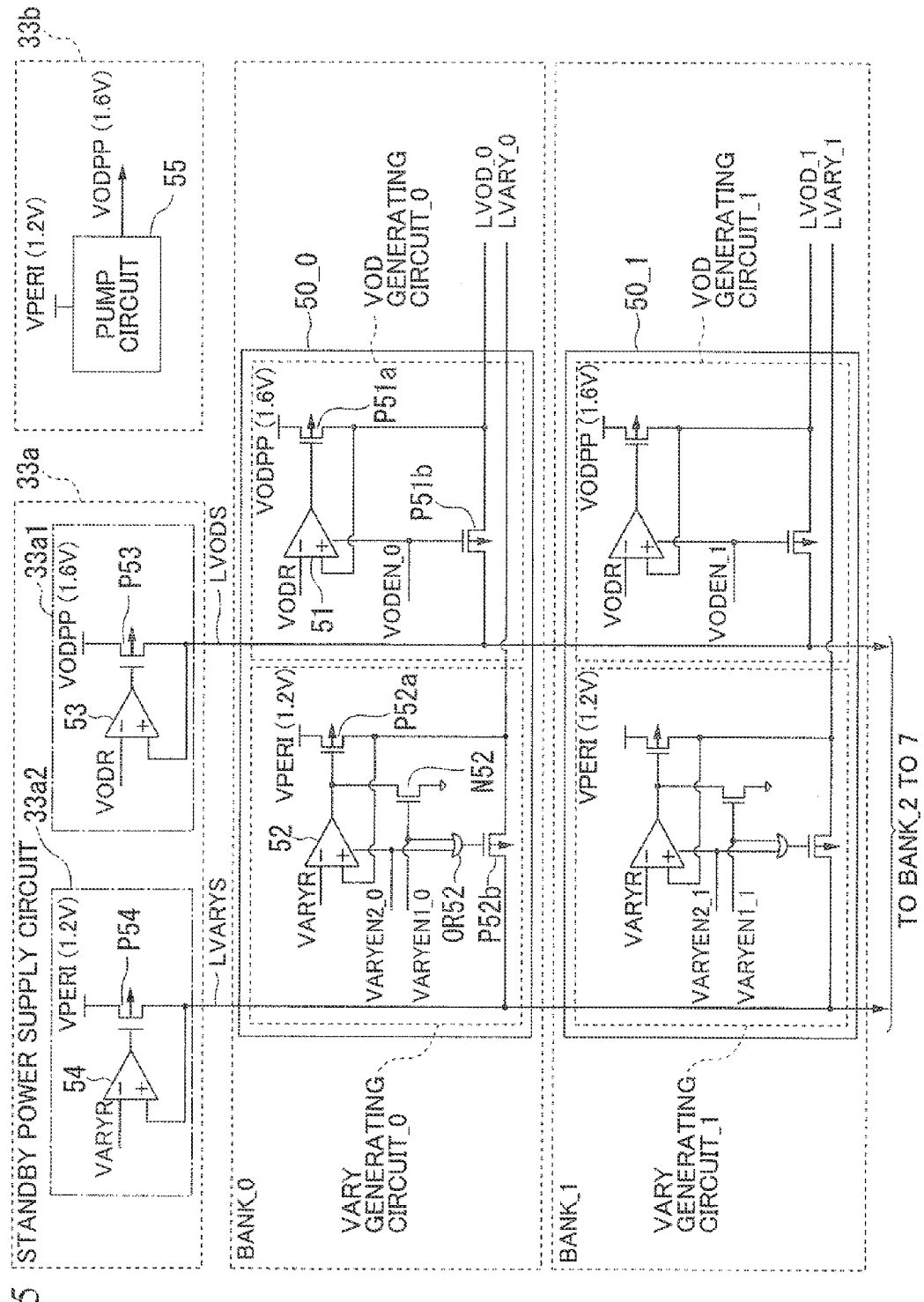
FIG. 5 is a circuit diagram illustrating a power voltage negating circuit in the memory bank in FIG. 2.

FIG. 5 is a circuit diagram of the power supply voltage generating circuit 50_k provided in each of the memory banks BANK_k. The power supply voltage generating circuits 50_k all have the same circuit constitution, and at this point the power supply voltage generating circuit_0 of the memory bank BANK_0 shown in FIG. 5 will be described as the power supply voltage generating circuit 50_k of the memory bank BANK_k.

The power supply voltage generating circuit 50_k of the memory bank BANK_k has a VOD generating circuit_k and a VARY generating circuit_k. The VOD generating circuit_k generates the above-noted overdrive voltage VOD and supplies the overdrive voltage VOD to the first power supply line LVOD_k.

The VARY generating circuit_k generates the above-noted bit line final voltage VARY and supplies the bit line final voltage VARY to the second power supply line LVARY_k.

The VOD generating circuit_k is constituted to include a transistor P51a, a transistor P51b, and a comparator circuit 51.

In the transistor P51a, the source is connected to the internal voltage generating circuit 33 and has the first internal voltage VODPP input thereto, the gate is connected to the output of the comparator circuit 51, and the drain is connected to the first power supply line LVOD_k.

In the comparator circuit 51, the inverting input terminal is connected to the reference voltage generating circuit 34 and has the first reference voltage VODR input thereto, the non-inverting input terminal is connected to the first power supply line LVOD_k, and the output terminal is connected to the gate of the transistor P51a. When an active-level (high-level) control signal VODEN_k (first activation signal) is input to the comparator circuit 51 from the BANK control circuit and BANK power supply control circuit 61, in the case in which the voltage level of the first power supply line LVOD_k is lower than the voltage level of the first reference voltage VODR, the voltage level that is output is lowered, and the current driving capacity of the transistor P51a is raised. When a high-level control signal VODEN_k is input to the comparator circuit 51, in the case in which the voltage level of the first power supply line LVOD_k is higher than the voltage level of the first reference voltage VODR, the voltage level that is output is raised, and the current driving capacity of the transistor P51a is lowered. That is, the comparator circuit 51 varies the output so that the voltage level of the first power supply line LVOD_k coincides with the voltage level of the first reference voltage VODR, thereby controlling the amount of current of the transistor P51a.

In the transistor P51b, the source is connected to the common power supply line LVODS, the gate is connected to the BANK control circuit and BANK power supply control circuit 61 and has the control signal VODEN_k input thereto, and the drain is connected to the first power supply line LVOD_k. When the control signal VODEN_k is at the active level (high level), the transistor P51b places the first power supply line LVOD_k and the common power supply line LVODS into the electrically non-connected state, and when the control signal VODEN_k is at the inactive level (low level), the transistor P51b electrically connects the first power supply line LVOD_k and the common power supply line LVODS.

The VARY voltage generating circuit_k is constituted by a transistor P52a, a transistor P52b, a comparator circuit 52, and a transistor N52.

In the transistor P52a, the source is connected to the internal voltage generating circuit 33 and has the second internal voltage VPERI input thereto, the gate is connected to the output of the comparator circuit 52, and the drain is connected to the second power supply line LVARY_k.

In the comparator circuit 52, the inverting input terminal is connected to the reference voltage generating circuit 34 and has the second reference voltage VARYR connected thereto, the non-inverting input terminal is connected to the second power supply line LVERY_k, and the output terminal is connected to the gate of the transistor P52a. When an active-level (high level) control signal VARYEN2_k (second activation signal, fourth activation signal) is input to the comparator circuit 52 from the BANK control circuit and BANK power supply control circuit 61, in the case in which the voltage level of the second power supply line LVARY_k is lower than the second reference voltage VARYR, the voltage level that is output is lowered and the current driving capacity of the transistor P52a is raised. When a high-level control signal VARYEN2_k is input to the comparator circuit 52, in the case in which the voltage level of the second power supply line LVARY_k is higher than the voltage level of the second reference voltage VARYR, the voltage level that is output is raised and the current driving capacity of the transistor P52a is lowered. That is, the comparator circuit 52 varies the output so that the voltage level of the second power supply line LVARY_k coincides with the voltage level of the second reference voltage VARYR, thereby controlling the amount of current of the transistor P52a.

An OR circuit OR52 is a two-input, one-output logical sum circuit, the two input to which are control signal VAREN1_k (second activation signal, third activation signal) and the control signal VAREN2_k from the BANK control circuit and BANK power supply control circuit 61, and the output thereof is connected to the gate of the transistor P52b.

In the transistor P52b, the source is connected to the common power supply line LVARYS, the gate is connected to the output of the OR circuit OR52, and the drain is connected to the second power supply line LVARY_k. When either one of the control signal VARYEN1_k and the control signal VARYEN2_k is at the active level (high level), the transistor P52b places the second power supply line LVARY_k and the common power supply line LVARYS in the electrically non-connected state, and when both of the control signal VARYEN1_k and the control signal VARYEN2_k are in the inactive level (low level), the transistor P52b electrically connects the second power supply line LVARY_k and the common power supply line LVARYS.

In the transistor N52, the drain is connected to the output of the comparator circuit 52 and the gate of the transistor P52a, the gate is connected to the BANK control circuit and BANK power supply control circuit 61 and has the control signal VARYEN1_k input thereto, and the source is grounded. When a high-level control signal VARYEN1_k is input to the transistor N52, the gate of the transistor P52a is discharged to the ground level, and the transistor P52a is turned on (placed in the conducting state). By doing this, the transistor P52a drives the second power supply line LVARY_k with the second internal voltage VPERI.

A standby power supply circuit 33a is constituted by a first standby power supply circuit 33a1 and a second standby power supply circuit 33a2, and is provided in the peripheral circuitry outside of the memory banks. The common power supply line LVODS, which is the output interconnect of the first standby power supply circuit 33a1, and the common power supply line LVARYS, which is the output interconnect of the second standby power supply circuit 33a2 are connected to the inside of the memory bank area 60, and are each connected to the VOD generating circuit_k and VARY generating circuit_k in each memory bank, which have been described above. Of course, the constitution may be such that the standby power supply circuit 33a is provided in the internal voltage generating circuit 33 shown in FIG. 1.

The first standby power supply circuit 33a1 is constituted by a transistor P53 and a comparator circuit 53.

In the transistor P53, the source is connected to the internal voltage generating circuit 33 and has the first internal voltage VODPP is input thereto, the gate is connected to the output of the comparator circuit 53, and the drain is connected to the common power supply line LVODS.

In the comparator circuit 53, the inverting input terminal is connected to the reference voltage generating circuit 34, and has the first reference voltage VODR input thereto, the non-inverting input terminal is connected the common power supply line LVODS, and the output terminal is connected to the gate of the transistor P53. In the case in which the voltage level of the common power supply line LVODS is lower than the voltage level of the first reference voltage VODR, the comparator circuit 53 lowers the voltage level of the output, and the current driving capacity of the transistor P53 is raised. In the case in which the voltage level of the common power supply line LVODS is higher than the voltage level of the first reference voltage VODR, the comparator circuit 53 raises the voltage level of the output, and the current driving capacity of the transistor P53 is lowered. That is, the comparator circuit 53 varies the output so that the voltage level of the common power supply line LVOD coincides with the voltage level of the first reference voltage VODR, thereby controlling the amount of current of the transistor P53.

The second standby power supply circuit 33a2 is constituted by a transistor P54 and a comparator circuit 54.

In the transistor P54, the source is connected to the internal voltage generating circuit 33 and has the second internal voltage VPERI input thereto, the gate is connected to the output of the comparator circuit 54, and the drain is connected to the common power supply line LVARYS.

In the comparator circuit 54, the inverting input terminal is connected to the reference voltage generating circuit 34 and has the second reference voltage VARYR input thereto, the non-inverting input terminal is connected the common power supply line LVARYS, and the output terminal is connected to the gate of the transistor P54. In the case in which the voltage level of the common power supply line LVARYS is lower than the voltage level of the second reference voltage VARYR, the comparator circuit 54 lowers the voltage level of the output, and the current driving capacity of the transistor P54 is raised. In the case in which the voltage level of the common power supply line LVARYS is higher than the voltage level of the second reference voltage VARYR, the comparator circuit 54 raises the voltage of the output, and the current driving capacity of the transistor P54 is lowered. That is, the comparator circuit 54 varies the output so that the voltage level of the common power supply line LVARYS coincides with the voltage level of the second reference voltage VARYR, thereby controlling the amount of current of the transistor P54.

The circuit shown by the reference symbol 33b is an internal voltage generating circuit 33b provided in the internal voltage generating circuit 33, and is constituted to include a pump circuit 55. By the pump circuit 55, the second internal voltage VPERI rises by a charge pumping operation, and the first internal voltage VODPP is generated. This first internal voltage VODPP generates the above-described overdrive voltage VOD, which is used as the power supply for the VOD generating circuit_k that supplies the first power supply line LVOD_k and for the second standby power supply circuit 33a2. Although in the present embodiment, the first internal voltage VODPP is generated in this manner by raising the second internal voltage VPERI by the pump circuit 55, the present invention is not restricted in this manner, and the power supply terminal 15a that is supplied with an external voltage VDD may be directly connected to the first internal voltage VODPP interconnect, and the external voltage VDD may be supplied directly to the VOD generating circuit_k and the second standby power supply circuit 33a2, without an increase, depending upon the external voltage VDD.

In this manner, the VOD generating circuit_k (overdrive voltage generating circuit) and the VARY voltage generating circuit_k are controlled by the control signal VODEN_k, the control signal VARYEN1_k, and the control signal VARYEN2_k, which are activated in response to an active command or a refresh command. Each of the comparator circuits (comparator circuit 51 and comparator circuit 52) that are provided in the VOD generating circuit_k and the VARY voltage generating circuit_k operates in response to the activation of the control signals VODEN_k and VARYEN2_k. In this manner, a power supply voltage generating circuit 50_k is provided in each of the memory banks BANK_k. For example, a case can be envisioned in which, in the memory bank BANK_0, when the refresh command is accessed and the bit line final voltage VARY is consumed in the sensing operation, an active command is accessed in the memory bank BANK_1 and the overdrive voltage VOD is being consumed in a sensing operation. Even in such a case, because the second power supply line LVARY_k is separated between each memory bank BANK_k, the second power supply line LVARY_k that supplies the voltage of the SA power supply line (sense amplifier power supply line) within the memory bank BANK_1 is not influenced by power supply noise occurring on the second power supply line LVARY_0 within the base material BANK_0. That is, as shown in FIG. 10, in the case in which the memory bank BANK_1 is accessed by an active command, because there is no influence from the sagging (drop) of the level on the second power supply line LVARY_0 of the memory bank BANK_0 that is being refreshed, it is possible to prevent a delay in the time to access the memory bank BANK_1.

Also, in standby, the standby voltages output from the standby power supply circuits provided in the peripheral circuitry outside of the memory banks (the first standby voltage and the second standby voltage, which are equal, respectively, to the first reference voltage VODR and the second reference voltage VARYR) are supplied to the common power supply line LVODS and the common power supply line LVARYS, respectively. That is, even in standby, these standby voltages are supplied to the internal voltage first power supply line LVOD_k and second power supply line LVARY_k. In standby, however, there is almost no current consumption by the overdrive voltage VOD and the bit line final voltage VARY. For this reason, the standby power supply circuits are provided in common between a plurality of the memory banks. Additionally, the size (channel width W) of the transistors for supplying the standby power supply circuit power supply (P53, P53) can be established as smaller than the transistors of the power supply voltage generating circuits (P51a, P52b), thereby enabling a reduction in the layout surface area of the standby power supply circuits in the semiconductor device 10.

The method of generating the control signals that control the SA power supply control circuit 41, the SA control circuit 43, and the power supply voltage generating circuits 50_k (VOD generating circuit_k and VARY generating circuit_k) in each memory bank BANK_k will be described, with references made to FIG. 6 to FIG. 8.

Figure 6:
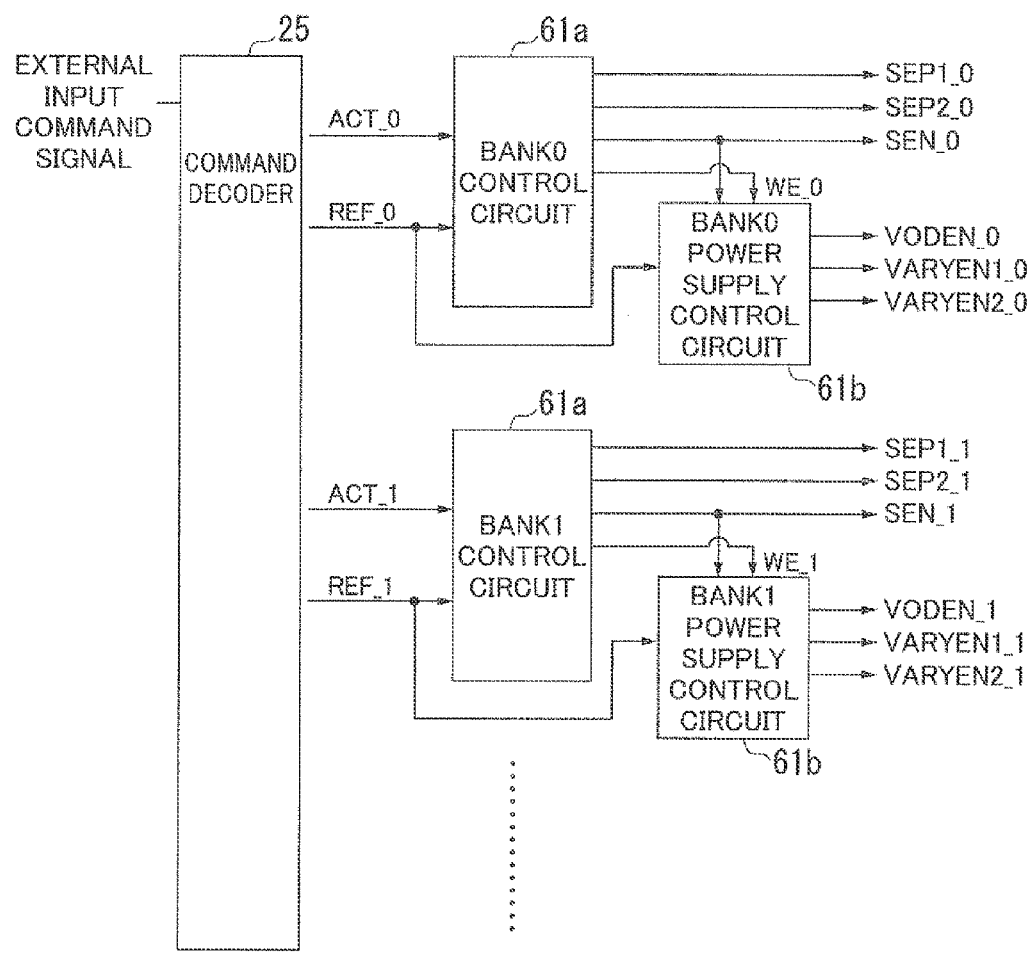
FIG. 6 is a block diagram of configurations of a command decoder, a bank control circuit and a bank power control circuit in FIG. 1.

FIG. 6 is a block diagram of the BANK control circuit and BANK power supply control circuit 61 that generates and outputs the control signals that control the SA power supply control circuit 41, the SA control circuit 43, and the power supply voltage generating circuits 50_k (VOD generating circuit_k and VARY generating circuit_k) in each memory bank BANK_k.

Figure 7:
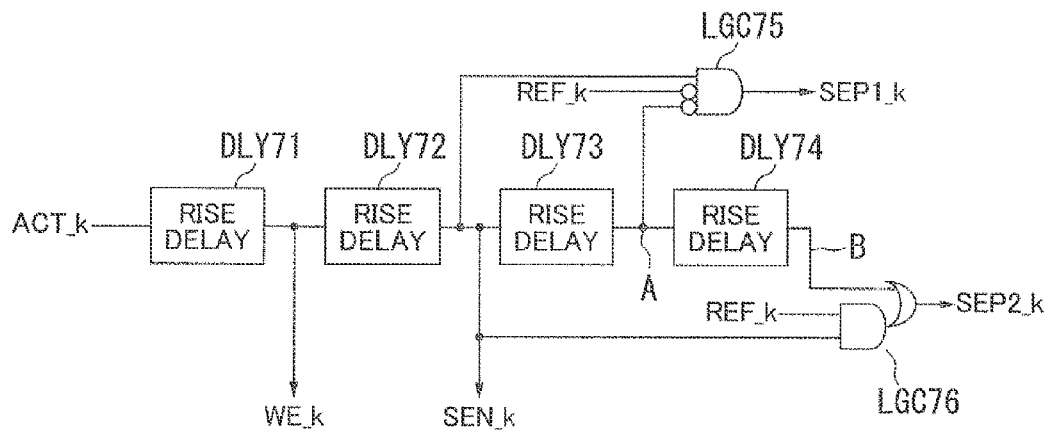
FIG. 7 is a block diagram of the configuration of one of the bank power control circuits of FIG. 6.

FIG. 7 is a circuit diagram of the BANKk control circuit corresponding to each memory bank BANK_k in the BANK control circuit and BANK power supply control circuit 61. FIG. 8 is a circuit diagram of the BANKk power supply control circuit corresponding to each memory bank BANK_k in the BANK control circuit and BANK power supply control circuit 61.

As shown in FIG. 6, the BANK control circuit and BANK power supply control circuit 61 is constituted by a plurality each of a BANK_k control circuit (indicated by the reference symbol 61a) and a BANK_k power supply control circuit (indicated by the reference symbol 61b) provided in correspondence to each memory bank BANK_k (in the present embodiment, eight are provided in correspondence to the memory banks BANK_0 to BANK_7).

A command from outside (such as an active command or refresh command) is input to the command decoder 25 via the command input circuit 24 (refer to FIG. 1), and is output as an internal command signal (ACT_k, REF_k). The Bank_k control circuit receives the internal command signal ACT_k and REF_k and outputs the control signals SEP1_k, SEP2_k, SEN_k and WE_k. Of these, the control signals SEP1_k and SEP2_k are input to the SA power supply control circuit 41 (refer to FIG. 4) and control the power supply voltage to the sense amplifier SA. The control signal SEN_k is input to the SA control circuit 43 and controls the amplification operation of the sense amplifier SA. The Bank_k power supply control circuit receives the control signals SEN_k and WE_k output from the internal command signal REF_k and the Bank_k control circuit, and outputs the control signal VODEN_k, the control signal VARYEN2_k, and the control signal VARYEN2_k. These control signals are input to the power supply voltage generating circuit 50_k (VOD generating circuit_k and VARY generating circuit_k) and, are used to decide the timing period for driving the first power supply line LVOD_k or the second power supply line LVARY_k, in response to the overdrive voltage VOD and the bit line final voltage VARY, respectively.

The Bank_k control circuit, as shown in FIG. 7, is constituted to include a delay circuit DLY71, a delay circuit DLY72, a delay circuit DLY73, a delay circuit DLY74, and a logic circuit LGC75.

Figure 8:
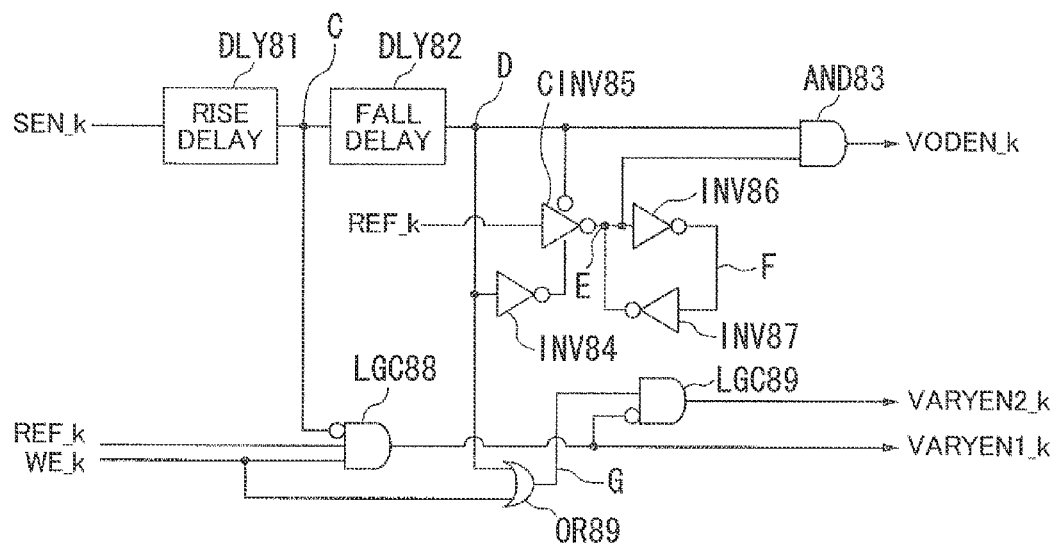
FIG. 8 is a block diagram of the configuration of the other of the bank power control circuits of FIG. 6.

The Bank_k power supply control circuit, as shown in FIG. 8, is constituted to include a delay circuit DLY81, a delay circuit DLY82, an AND circuit AND83, a clocked inverter circuit CINV85, an inverter circuit INV84, an inverter circuit INV86, an inverter circuit INV87, a logic circuit LGC88, an OR circuit OR89, and a logic circuit LGC89.

In FIG. 7 and FIG. 8, the reference symbols A to G indicate internal connection points. Of the delay circuits, the delay circuits indicated as "rise delay" are delay circuits in which the amount of time between the transition of the input signal to the delay circuit from the inactive level to the active level to the time the delay circuit outputs an output signal is set to be longer than the amount of time between the transition of the input signal to the delay circuit from the active level to the inactive level to the time the delay circuit outputs an output signal. The delay circuits indicated as "fall delay" are delay circuits in which the amount of time between the transition of the input signal to the delay circuit from the active level to the inactive level to the time the delay circuit outputs an output signal is set to be longer than the amount of time between the transition of the input signal to the delay circuit from the inactive level to the active level to the time the delay circuit outputs an output signal.

In the Bank_k control circuit shown in FIG. 7, the delay circuit DLY71 delays the internal command signal ACT_k, and outputs the control signal WE_k, outputting the control signal WE_k also to the input of the next stage circuit, which is the delay circuit DLY72, as well.

The delay circuit DLY72 delays the input control signal WE_k, and outputs the control signal SEN_k, outputting the control signal SEN_k also to the input of the next stage circuit, which is the delay circuit DLY73, and to the first input of the three inputs of the logic circuit LGC75.

The delay circuit DLY73 delays the input control signal SEN_k, and outputs the delayed signal, via the connection point A, to the third input of the three inputs of the logic circuit LGC75 and to the input of the delay circuit DLY74.

The delay circuit DLY74 delays the input signal from the delay circuit DLY73 and outputs the delayed signal, via the connection point B, to the first input of the three inputs of the logic circuit LGC76.

The logic circuit LGC75 is constituted to include a three-input, one-output logical product circuit that, with the combination of the control signal SEN_k input to the first input being the high level, the internal command signal REF_k input to the second input being the low level, and the connection point A connected to the third input being the low level, outputs an active level (high level) control signal SEP1_k. Also, when the control signal SEN_k is the low level or either the internal command signal REF_k is high level or the connection point A is high level, the logic circuit LGC75 outputs an inactive level (low level) control signal SEP1_k.

When the connection point B connected to the first input is high, or both the control signal SEN_k input to the second input and the internal command REF_k input to the third input are the high level, the logic circuit LGC76 outputs an active level (high level) control signal SEP2_k. The logic circuit LGC76, when the connection point B is the low level and also either one of the control signal SEN_k and the internal command signal REF_k is the low level, outputs an inactive level (low level) control signal SEP2_k.

In the Bank_k power supply control circuit shown in FIG. 8, the delay circuit DLY81 delays the control signal SEN_k input from the Bank_k control circuit and outputs the delayed signal, via the connection point C, to the first input of the three inputs of the logic circuit LGC88, and to the input of the delay circuit DLY82.

The delay circuit DLY82 delays the input signal from the delay circuit DLY81, and outputs the delayed signal, via the connection point D, to the first input of the two inputs of the AND circuit AND83, the power supply terminal of the clock inverter circuit CINV85, the input of the inverter circuit INV84, and the first input of the OR circuit OR89.

The inverter circuit INV84 logically inverts the input signal from the delay circuit DLY82, and outputs the result to the ground terminal of the clock inverter circuit CINV85.

When the internal command signal REF_k input from the command decoder 25 is at the high level and also the internal command signal ACT_k changes to the high level and the connection point D is at the high level, the clock inverter circuit CINV85 outputs a low level output signal, via the connection point E, to the input of the inverter circuit INV86 and the second input of the NAND circuit NAND83. When the internal command signal REF_k input from the command decoder 25 is at the low level and also the internal command ACT_k changes to the high level and the connection point D is at the high level, the clock inverter circuit CINV85 outputs a high level output signal, via the connection point E, to the input of the inverter circuit INV86 and the second input of the AND circuit AND83.

The AND circuit AND83 is a two-input, one-output logical product circuit, the first input of the two inputs thereof being connected to the connection point D and the second input thereof being connected to the connection point E, and outputs the control signal VODEN_k from its output.

The inverter circuit INV86 logically inverts the level of the connection point E, and outputs the result, via the connection point F, to the input of the inverter circuit INV87. The inverter circuit INV87 logically inverts the level at the connection point F and outputs the result to the input of the inverter circuit INV86. The inverter circuits INV86 and INV87 constitute a flip-flop, which latches the level at the connection point F.

This is to prevent the output of a high-level signal to the connection point E, in the case in which the clock inverter circuit CINV85, after the internal command signal REF_k changes to the high level, the control signal SEN_k changes to the high level and the connection point D changes to the high level (with the internal command signal REF_k at the high level and also the internal command signal ACT_k at the high level). That is, the clock inverter circuit CINV85 causes the connection point E to transition to the low level when the internal command signal REF_k changes to the high level. Then, although the internal connection point D changes to the high level when the control signal SEN_k changes to the high level, the connection point E transitions to the high level at this time and the low level is maintained on the connection point E (and the connection point F is maintained at the high level), so that the AND circuit AND83 does not output an active-level (high-level) control signal VODEN_k.

The logic circuit LGC88 is constituted to include a three-input, one-output logical product circuit that, with the combination of the connection point C connected to the first input being at the low level, the internal command signal REF_k input to the second input being at the high level, and the control signal WE_k input to the third input being at the high level, outputs an active-level (high-level) control signal VARYEN1_k. Also, when the control signal SEN_k is at the high level and the connection point C is at the high level, or the internal command signal REF_k is at the low level, or the control signal WE_k is at the low level, the logic circuit LGC88 outputs an inactive-level (low-level) control signal VARYEN1_k.

The OR circuit OR89 is a two-input, one-output logical sum circuit, the first input of the two inputs of which is connected to the connection point D, and the second input is connected to the BANK_k control circuit and has the control signal WE_k input thereto, the output being connected, via the connection point G, to the first input of the logic circuit LGC89.

The logic circuit LGC89 is constituted to include a two-input, one-output logical product circuit that, when the connection point G connected to the first input thereof is at the high level, and also the control signal VARYEN1_k input to the second input thereof is at the low level, outputs an active-level (high-level) control signal VARYEN2_k. When the connection point G is at the low level or the control signal VARYEN2_k is at the high level, the logic circuit LGC89 outputs an inactive-level (low-level) control signal VARYEN2_k.

Next, the operation of the power supply voltage generating circuit 50_k in the memory bank BANK_k, in response to the control signals output by the BANK control circuit and BANK power supply control circuit 61, generating the overdrive voltage VOD or the bit line final voltage VARY will be described individually for the commands received by the memory bank BANK_k (active command and refresh command), with reference made to FIG. 9.

Figure 9A:
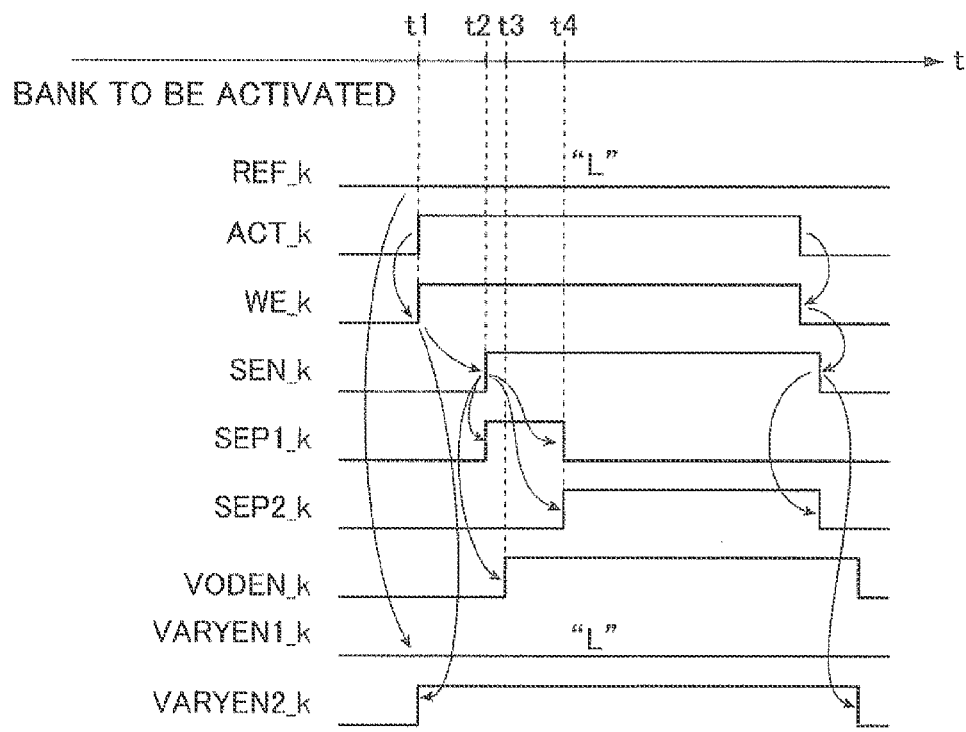
FIG. 9A is a timing chart of the bank control circuit and a bank power control circuit for active operation of FIG. 6.
Figure 9B:
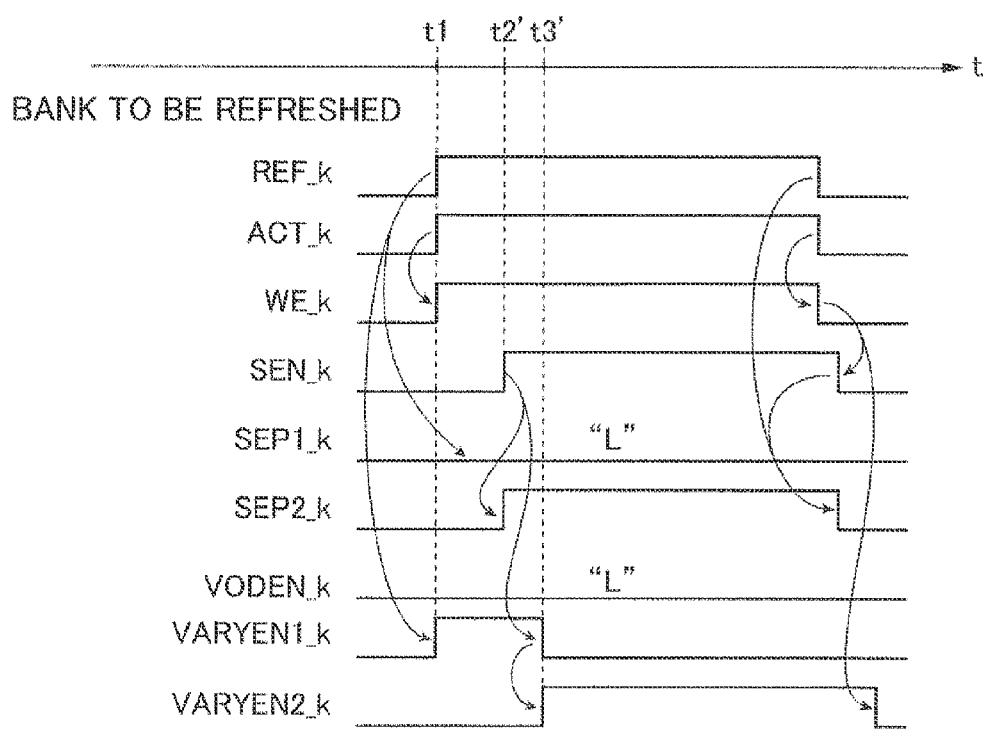
FIG. 9B is a timing chart of the bank control circuit and a bank power control circuit for refresh operation of FIG. 6.

FIG. 9A shows the variation over time of the control signals in the bank to be activated, that is, in the memory bank that is activated in response to the active command being input to the command input circuit 24 (the memory bank that received the active command). FIG. 9B shows the time-axis changes of the control signals in the bank to be refreshed, that is, in the memory bank that is activated in response to the refresh command being input to the command input circuit 24 (the memory bank that received the refresh command).

First, a memory bank that receives the active command will be described, using FIG. 9A.

At time t1, an active command (hereinafter, ACT command) is input to the semiconductor device 10 via the command input circuit 24, simultaneously with which a 3-bit bank address signal BA (not shown) is input to the address input circuit 27, and the command decoder 25 causes the internal command signal ACT_k to transition from the inactive level (low level) to the active level (high level).

When this occurs, the command decoder 25 maintains the internal command signal REF_k at the inactive level (low level).

The BANK_k control circuit causes the control signal WE_k output from the internal delay circuit DLY71 to transition from the inactive level (low level) to the active level (high level). The BANK_k power supply control circuit makes the output of the OR circuit OR89 (connection point G) the high level, and causes the control signal VARYEN2_k output from the logic circuit LGC89 to transition from the inactive level (low level) to the active level (high level). By doing this, the second power supply line LVARY_k, which is the output of the VARY generating circuit_k of the memory bank BANK_k, is in the state of being electrically non-connected from the common power supply line LVARYS. Because the internal command signal REF_k is at the low level, the BANK_k power supply control circuit maintains the control signal VARYEN1_k that is output by the logic circuit LGC88 at the inactive level (low level).

The BANK_k control circuit delays the control signal WE_k by the delay circuit DLY72 and, at time t2, causes the control signal SEN_k to transition from the inactive level (low level) to the active level (high level). The BANK_k control circuit causes the control signal SEP1_k output by the logic circuit LGC75 to transition from the inactive level (low level) to the active level (high level).

By doing this, the SA power supply control circuit 41 connects the first power supply line LVOD_k and the SA power supply line, and the SA control circuit 43 starts the amplification operation that amplifies the potential on the bit line. When this occurs, because the control signal VODEN_0 is still at the low level, the first power supply line LVOD_k, which is the output of the VOD generating circuit_k of the memory bank BANK_k, is in the state of being electrically connected to the command power supply line LVARYS. Although the standby power supply circuit 33a1 drives the first power supply line LVOD_0 with the overdrive voltage VOD, because this corresponds to the beginning of the period of starting the operation of the sense amplifier SA, the amount of current flowing in the first power supply line LVOD_k is small compared with the period of time (time t3 to t4) in which the bit line potential is quickly amplified.

The BANK_k power supply control circuit delays the control signal SEN_k by the delay circuit DLY81 and the delay circuit DLY82 and, at time t3, causes the control signal VODEN_k to transition from the inactive level (low level) to the active level (high level).

By doing this, the first power supply line LVOD_k, which is the output of the VOD generating circuit_k of the memory bank BANK_k, is in the state of being electrically non-connected from the common power supply line LVARYS. The VOD generating circuit_k, by the comparator circuit 51 and the transistor P51a, drives the first power supply line LVOD_k with the overdrive voltage VOD. The sense amplifier SA, by the overdrive voltage VOD supplied to the SA power supply line, amplifies the bit line potential at high speed.

At time t4, the BANK_k control circuit delays the control signal SEN_k by the delay circuit DLY73, makes the connection point A the high level, and causes the control signal SEP1_k output by the logic circuit LGC75 to transition from the active level (high level) to the inactive level (low level). The BANK_k control circuit also delays the output signal of the delay circuit DLY73 by the delay circuit DLY74, makes the connection point B the high level, and causes the control signal SEP2_k output by the logic circuit LGC76 to transition from the inactive level (low level) to the active level (high level).

By doing this, the SA power supply control circuit 41 places the first power supply line LVOD_k and the SA power supply line in the non-connected state, and connects the second power supply LVARY_k and the SA power supply line. That is, the amplification operation by the sense amplifier SA is completed in a prescribed period of time (between time t2 and t4) in which the SA power supply line is overdriven to the overdrive voltage VOD by the VOD generating circuit_k. Subsequent to this (after time t4), the VARY generating circuit_k supplies to the SA power supply line the bit line final voltage VARY, which is lower than the overdrive voltage VOD, and the sense amplifier SA, in response to this voltage, either amplifies or maintains the potential on the bit line.

A memory bank that receives the refresh will be described, using FIG. 9B.

At time t1, a refresh command (hereinafter, REF command) is input to the semiconductor device 10 via the command input circuit 24, simultaneously with which a 3-bit bank address BA (not shown) is input to the address input circuit 27, and the command decoder 25 causes the internal command signal ACT_k and the internal command signal REF_k to transition from the inactive level (low level) to the active level (high level).

The BANK_k power supply control circuit causes the control signal VARYEN1_k, which is the output signal of the logic circuit LGC88, to transition from the inactive level (low level) to the active level (high level). By doing this, the second power supply line LVARY_k, which is the output of the VARY generating circuit_k of the memory bank BANK_k goes into the state of being electrically non-connected to the common power supply line LVARYS.

Because the control signal VARYEN1_k is at the high level, the BANK_k power supply control circuit, by the logic circuit LGC89, maintains the control signal VARYEN2_k at the inactive level (low level). Because the internal command signal REF_k is at the high level, the BANK_k control circuit, by the logic circuit LGC75, maintains the control signal SEP1_k at the inactive level (low level). The BANK_k control circuit causes the control signal WE_k that is output from the internal delay circuit DLY71 to transition from the inactive level (low level) to the active level (high level).

The BANK_k control circuit delays the control signal WE_k by the delay circuit DLY72 and, at time t2', causes the control signal SEN_k to transition from the inactive level (low level) to the active level (high level). The BANK_k control circuit also causes the control signal SEP2_k output by the delay circuit LGC76 to transition from the inactive level (low level) to the active level (high level).

By doing this, the SA power supply control circuit 41 connects the second power supply line LVARY_k and the SA power supply line by the transistor N41b. By the transistor N41b, the SA control circuit 43 starts the amplification operation that amplifies the potential on the bit line. When this occurs, because the control signal VARYEN1_k is at the high level, the VARY generating circuit_k of the memory bank BANK_k turns the transistor P52a on and drives the second power supply line VARY_k in response to the second internal voltage VPERI, and in makes the amount of current flowing in the first power supply line LVOD_k sufficient for the amplification operation in the beginning of the period of starting the operation of the sense amplifier SA. The BANK_k power supply control circuit delays the control SEN_k by the delay circuit DLY81 and, at time t3', causes the control signal VARYEN1_k output by the logic circuit LGC88 to transition from the active level (high level) to the inactive level (low level). Because the control signal VARYEN1_k is at the low level, the BANK_k power supply control circuit also causes the control signal VARYN2_k output by the logic circuit LGC89 to transition from the inactive level (low level) to the active level (high level).

By doing this, in the VARY generating circuit_k, the transistor N52 is turned off and the comparator circuit 52 is activated, after which the AVRY generating circuit_k drives the second power supply LVARY_k in response to the bit line final voltage VARY, by the comparator circuit 52 and the transistor P52a.

Subsequent to this (after time t3'), the VARY generating circuit_k supplies to the SA power supply line the bit line final voltage VARY, which is lower than the overdrive voltage VOD, and the sense amplifier SA, in response to this voltage, either amplifies or maintains the potential on the bit line.

As described above, at the time of an amplification operation in response to an ACT command by the memory bank BANK_k, the activation period of the control signal SEP1_k (from time t2 to t4, in which it is at the active level) is the period of time that the SA power supply line is overdriven.

In contrast, at the time of an amplification operation in response to an REF command by the memory bank BANK_k, the control signal SEP1_k is not activated (refer to FIG. 9B). That is, the sense amplifier SA, in response to the bit line final voltage VARY (second voltage) supplied to the SA power supply line, amplifies the potential on the bit line. In the activation period of the control signal VARYEN1_k (from time t1 to t3'), the second internal voltage VPERI (the third voltage, which is also included in the second voltage) that is lower than the overdrive voltage VOD is forcibly generated by the VARY voltage generating circuit, after which (after time t3'), in response to the activation of the control signal VARYEN2_k, control by the comparator circuit 52 is started, and the bit line final voltage VARY (second voltage) that is lower than the overdrive voltage VOD is caused to be generated, without activating the comparator circuit 52 of the VARY voltage generating circuit_k.

An example of the independent supply of commands (the active command ACT and the refresh command REFpb) to the plurality of memory banks BANK_0 to BANK_7 in the semiconductor device 10 and the execution of an amplification operation by the sense amplifier SA in each memory bank will be described, with reference made to FIG. 10.

FIG. 10 is a timing chart that shows the time-axis changes of the voltage levels of the first power supply LVOD_k (k=0 to 7), the second power supply line LVARY_k, and the bit line BL_k when two memory banks of the memory bank area 60 receive, respectively, the active command and the refresh command.

In FIG. 10, for example, a refresh command REFpb (Refresh Per Bank command that refreshes one bank) is accessed by the memory bank BANK_0 and, after a prescribed amount of time (after an amount of time corresponding to time t1 to time t1') an active command ACT is accessed by the memory bank BANK_1.

As shown in FIG. 10, in the memory bank BANK_0, because the first power supply line LVOD_0 is not connected to the SA power supply line but is connected to the common power supply line LVODS, which is the output of the standby power supply circuit 33a1, the voltage level is constant, with no change.

That is, in the memory bank BANK_0, amplification of the bit line potential is caused with only the current supplied from the VARY generating circuit_0 to the second power supply line LVARY_0, without consuming current supplied in the first power supply line LVOD_0.

In contrast, in the memory bank BANK_1, because the first power supply line LVOD_1 is connected to the SA power supply line and the bit line potential is amplified for a prescribed time (the time between t2' and time t3'), compared to the memory bank BANK_0, the bit line potential is more quickly amplified.

Also, because the second power supply lines LVARY_k are separated for each memory bank, even if current supplied to the second power supply line LVARY_0 is consumed in memory bank BANK_0, and there is a voltage drop in the second power supply line LVARY_0 as shown in the drawing, this voltage drop does not influence the second power supply line LVARY_1 of the memory bank BANK_1, and the voltage level on the second power supply line LVARY_1 does not change.

Also, in the other memory banks BANK_2 to BANK_7, which receive neither the active command nor the refresh command, in response to a voltage that is supplied via the common power supply line LVARYS and the common power supply line LVODS from the standby power supply circuit 33a (refer to FIG. 5), the first power supply lines LVOD_2 to 7 are maintained at the voltage level of the overdrive voltage VOD (the voltage level of the first reference voltage VODR), and the second power supply lines LVARY_2 to 7 are maintained at the voltage level of the bit line final voltage (voltage level of the second reference voltage VARYR).

In this manner, the semiconductor device 10 has bit lines (BL and /BL) and a power supply line (SA power supply line) and also has a sense amplifier SA that causes amplification of the potential on the bit line using a voltage supplied to the power supply line, and a power supply voltage generating circuit (VOD generating circuit_k and VARY generating circuit_k) that, when the active command is activated, performs overdrive for a prescribed period of time at the beginning of the voltage supplying time corresponding to the active command and supplies to a power supply line a first voltage (overdrive voltage VOD) and after a prescribed amount of time supplies a second voltage (bit line final voltage VARY) that is lower than the first voltage, and that, when the refresh command is activated, supplies to a power supply line a second voltage from the beginning of the voltage supplying period corresponding to the refresh command, without performing overdrive.

By doing this, because at the time of a refresh the second voltage, which is lower than the first voltage used for overdrive, is used to amplify the bit line potential from the beginning of the voltage supplying period corresponding to the refresh command, without performing overdrive, compared with conventional art, the present invention can greatly reduce the amount of current consumption.

The technical concept of the present application can be applied to a semiconductor device having various functions other than that of a memory. Additionally, the form of the circuits within each circuit block disclosed in the drawings, and other circuits that generate control signals are not restricted to the forms of the circuits disclosed in the embodiments.

The technical concept of the present invention can be applied to diverse semiconductor devices.

For example, the present invention can be applied to a broad range of semiconductor devices, such as a CPU (central processing unit), an MCU (microcontrol unit), a DSP (digital signal processor), an ASIC (application-specific integrated circuit), and ASSP (application-specific standard product), and a memory or the like. Examples that can be cited of semiconductor device products in which the present invention is applied include an SOC (system-on-chip), MCP (multichip package), and a POP (package-on-package). It is possible to apply the present invention to these arbitrary product forms and to semiconductor devices having these package types.

It is sufficient that the transistors be field effect transistors (FETs), and in addition to MOS (metal oxide semiconductor) transistors, application is possible to MIS (metal-insulator semiconductor) and thin-film transistors (TFTs) and the like. Application is possible to various types of FETs. Additionally, the apparatus may include in part bipolar transistors.

In addition, the NMOS transistor (n-channel MOS transistor) and the PMOS transistor (p-channel MOS transistor) are typical examples of transistors of the first conduction type and transistors of the second conduction type, respectively.

A variety of combinations or selections of the disclosed elements is possible within the scope of the claims of the present invention. That is, the present invention, of course, encompasses various variants and modification that a person skilled in the art could make, in accordance with the entire disclosure, including the claims and the technical concept thereof.

The term "configured" is used to describe a component, section or part of a device includes hardware and/or software that is constructed and/or programmed to carry out the desired function.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A device comprising:
a bit line;
a power line supplied with a power voltage;
a sense amplifier circuit amplifying a voltage of the bit line by using the power voltage of the power line;
a first line and a second line;
a first voltage generating circuit configured to supply a first voltage to the first line;
a second voltage generating circuit configured to supply a second voltage to the second line, the second voltage being lower than the first voltage;
a control circuit configured to respond to an active command and supply, as the power voltage, the power line with the first voltage during a first period and the second voltage during a second period, the control circuit being further configured to respond to a refresh command and supply, as the power voltage, the power line with the second voltage during both the first and second periods;
a first standby power supply circuit configured to supply the first line with the first voltage during a third period excluding the first and second periods; and
a second standby power supply circuit configured to supply the second line with the second voltage during the third period.

2. The device according to claim 1, further comprising another power line supplied with another power voltage, wherein,
the control circuit is further configured to respond to the active command and supply, as the other power voltage, the other power line with a ground voltage during both the first and second periods, and wherein the control circuit is further configured to respond to the refresh command and supply, as the other power voltage, the other power line with the ground voltage during both the first and second periods.

3. The device according to claim 1, further comprising:
a first transistor provided between the first line and the power line and controlled by a first control signal; and
a second transistor provided between the second line and the power line and controlled by a second control signal; wherein,
the control circuit is further configured to respond to the active command and activate the first control signal during the first period and the second control signal during the second period, the control circuit being further configured to respond to the refresh command and activate the second control signal during both the first and second periods.

4. The device according to claim 1, further comprising a plurality of memory banks, each including the bit line, the power line, the sense amplifier circuit, the first and second lines, the first and second transistors, and the first and second voltage generating circuits.

5. The device according to claim 4, wherein each of the memory banks further includes another power line supplied with another voltage wherein,
the control circuit each of the memory banks is further configured to respond to the active command and supply, as the other power voltage, the other power line with a third voltage during both the first and second periods,
the control circuit of each of the memory banks being further configured to respond to the refresh command and supply, as the other power voltage, the other power line with the third voltage during both the first and second periods.

6. A method comprising:
using a first voltage generating circuit to supply a first voltage to a first line;
using a second voltage generating circuit to supply a second voltage to a second line, wherein the second voltage is less than the first voltage;
in an active operation mode, using a sense amplifier circuit to amplify a potential of a bit line by using the first voltage during a first period and the second voltage during a second period;
in a refresh mode, using the sense amplifier circuit to amplify the potential of the bit line by using only the second voltage during both the first and second periods;
using a first standby power supply circuit to supply the first line with the first voltage during a third period that excludes the first and second periods; and
using a second standby power supply circuit to supply the second line with the second voltage during the third period.

7. The method according to claim 6, comprising:
in the active operation mode, activating a first control signal to control a first transistor provided between the first line and a power line electronically coupled to the sense amplifier circuit to supply the first voltage to the power line during the first period and activating a second control signal to control a second transistor provided between the second line and the power line to supply the second voltage to the power line during the second period; and
in the refresh mode, activating the second control signal to control the second transistor to supply the second voltage to the power line during both the first and second periods.

8. The method according to claim 6, comprising:
in the active operation mode, supplying a ground voltage to another power line electronically coupled to the sense amplifier during both the first and second periods; and
in the refresh mode, supplying the ground voltage to the other power line during both the first and second periods.

* * * * *